United States Patent [19]
Makino et al.

[11] Patent Number: 5,493,219
[45] Date of Patent: Feb. 20, 1996

[54] MRE SENSOR SIGNAL DETECTOR

[75] Inventors: Yasuki Makino, Okazaki; Seiki Aoyama, Toyohashi; Ichirou Izawa, Anjo; Tomoatsu Makino, Okazaki; Susumu Kuroyanagi, Anjo, all of Japan

[73] Assignee: Nippondenso Co., Ltd., Kariya, Japan

[21] Appl. No.: 227,649

[22] Filed: Apr. 14, 1994

[30] Foreign Application Priority Data

Apr. 15, 1993 [JP] Japan .................................. 5-088898
Dec. 24, 1993 [JP] Japan .................................. 5-326470

[51] Int. Cl.⁶ ............................ G01B 7/30; G01P 3/48
[52] U.S. Cl. .................... 324/207.25; 324/174
[58] Field of Search ...................... 324/207.23–207.26, 324/234, 235, 233, 252, 174, 173; 307/530, 351–353, 356, 358, 362, 363

[56] References Cited

U.S. PATENT DOCUMENTS

| | | |
|---|---|---|
| 4,293,814 | 10/1981 | Boyer . |
| 4,665,318 | 5/1987 | Toda et al. . |
| 4,951,300 | 8/1990 | Koike .................. 324/207.25 X |
| 5,001,363 | 3/1991 | Anami .................. 324/207.25 X |

FOREIGN PATENT DOCUMENTS

| | | |
|---|---|---|
| 51-154145 | 12/1976 | Japan . |
| 52-43379 | 4/1977 | Japan . |
| 52-109350 | 9/1977 | Japan . |
| 2202720 | 8/1990 | Japan . |
| 2206814 | 8/1990 | Japan . |
| 395799 | 4/1991 | Japan . |
| 469986 | 3/1992 | Japan . |
| 477671 | 3/1992 | Japan . |
| 8400452 | 2/1984 | WIPO . |

OTHER PUBLICATIONS

Patent Abstracts of Japan, JP61 091770, Sep. 11, 1986, vol. 10, No. 266.
Patent Abstracts of Japan, JP63 213199, Jan. 9, 1989, vol. 13, No. 4.
Patent Abstracts of Japan, JP40 069986, Jun. 23, 1992, vol. 16, No. 280.
Patent Abstracts of Japan, JP58 062514, Jun. 30, 1983, vol. 7, No. 150.

*Primary Examiner*—Sandra L. O'Shea
*Assistant Examiner*—Warren S. Edmonds
*Attorney, Agent, or Firm*—Cushman, Darby & Cushman

[57] ABSTRACT

A peak hold circuit 11 holds a peak value of an output signal from a rotating angle sensor 6. A bottom hold circuit 12 holds a bottom value of the output signal from the rotating angle sensor 6. A threshold value is set from the peak value by the peak hold circuit 11 and the bottom value by the bottom hold circuit 12 by resistors 24 to 27, analog switches 28 and 29 and a NOT circuit 31. A comparator 10 compares the output signal of the rotating angle sensor 6 with the set value thus set, and outputs a binary signal (digitized signal) in accordance with the comparison result.

12 Claims, 12 Drawing Sheets

5,493,219

MRE SENSOR SIGNAL DETECTOR

BACKGROUND OF THE INVENTION

1. Field of the Invention

This invention relates to a signal processing unit such as an MRE sensor or an image sensor. More particularly, it relates to a sensor signal processing unit which detects magnetism as an electrical signal and digitizes the detected signal.

2. Description of the Related Art

To digitize a sensor output, a method which effects digitization using a trimmed and fixed threshold value matching a sensor output has been generally used in the past.

However, this method cannot digitize with a high level of angle accuracy, when waveforms the peaks and valley of which change in each cycle of waveform or the waveforms have the period of lower frequency superimposed waveform (due, e.g., to eccentricity of a gear).

Therefore, Japanese Unexamined Patent Publication (Kokai) No. 4-77671 proposes a solution. According to this reference, an output signal of a sensor is passed through an amplifier having a large amplification factor and an amplifier having a small amplification factor, and the output signal of the amplifier having a large amplification factor is digitized using a peak hold value of the output signal of the amplifier having a small amplification factor as a threshold value. In other words, two signals having mutually different amplification levels are generated.

The prior art reference described above requires two amplifiers having different amplification factors. On the other hand, Japanese Unexamined Patent Publication (Kokai) No. 4-69986 discloses an apparatus for detecting the revolution of a rotary member by using a magnetoresistance element (MRE) (for example a ferromagnetic thin film resistor). When a gear-like rotary member rotates, the direction of a magnetic flux passing through the MRE changes, so that the output of the MRE also changes. The reference detects the revolution of the rotary member by digitizing the output change and effecting signal processing.

To convert the wave-like output from the MRE a digital output, or in other words, to digitize the output, the reference described above employs the following method to determine a threshold value. Namely, the method sets in advance the threshold values (an upper limit value S1 and a lower threshold value S2) of a binary pulse-forming comparator as digitization means, and always corrects the output of the MRE in such a manner that the output of the MRE crosses the threshold value, that is, in such a manner that digitization and detection can be carried out even when the output of the MRE changes.

To correct the output, a comparator for setting the upper limit and another comparator for setting the lower limit are provided, and when the output of the MRE exceeds the upper or lower limit value, a count value of an up/down counter is counted down or up using an oscillator to change the count value. This count value is used as an offset input, and offset adjustment is carried out so that the output of the MRE exists between the upper limit value and the lower limit value.

However, the output of the MRE includes an offset voltage and changes with the passage of time. Therefore, output correction must be always carried out so that the output of the MRE exists within the range of the set values as described above. In other words, the output correction circuit must be always kept operating. This means that the oscillator of the output correction circuit is always operating and an oscillation spike noise always occurs. If this spike noise occurs at the same time as the switching operation of the binary pulse forming comparator for digitizing the output of the MRE, the timing of the switching deviates somewhat, and this deviation results in an error in angle accuracy. This term "angle accuracy" means the level of reproducibility which represents at which level of the output waveform of the MRE sensor the digitization output is switched from 1 to 0 and vice versa. Accordingly, if the spike noise occurs, a very small deviation of the edge occurs when the binary pulse-forming comparator effects its comparison operation, and this deviation results in an error in angle accuracy. In the case of a crank angle/cam angle sensor used for controlling an engine of a vehicle, for example, absolute angle accuracy of ±0.1° and repeatability of 0.02° are requisites. Accordingly, external noises such as switching noise must also be cut off as much as possible.

It is therefore an object of the present invention to provide a sensor signal processing unit capable of simplifying a circuit construction in view of the problems described above. It is another object of the present invention to provide a sensor signal processing circuit capable of stopping the oscillation operation during normal operation after output correction.

SUMMARY OF THE INVENTION

To accomplish the objects described above, the sensor signal processing unit according to the present invention employs the following fundamental construction.

The sensor signal processing unit according to the present invention comprises peak hold means for holding a peak value of an output signal from a sensor, bottom hold means for holding a bottom value of the output signal from the sensor, threshold value setting means for setting a threshold value from the peak value by the peak hold means and the bottom value by the bottom hold means, and comparison means for comparing the output signal of the sensor with the threshold value set by the threshold value setting means and outputting a binary (digitized) signal in accordance with the comparison result.

According to the construction described above, the peak hold means holds the peak value of the output signal from the sensor and the bottom hold means holds the bottom value of the output signal from the sensor. The threshold value setting means sets the threshold value from the peak value by the peak hold means and the bottom value by the bottom hold means. The comparison means compares the output signal of the sensor with the threshold value set by the threshold value setting means, and outputs the binary signal in accordance with the comparison result. Accordingly, the present invention requires only one amplifier, as opposed to the prior art technology which requires an amplifier having a large amplification factor and an amplifier having a small amplification factor.

DESCRIPTION OF THE PREFERRED EMBODIMENT

A definite example of a sensor signal processing unit according to the present invention will be explained hereinafter with reference to the accompanying drawings.

Figure 1:
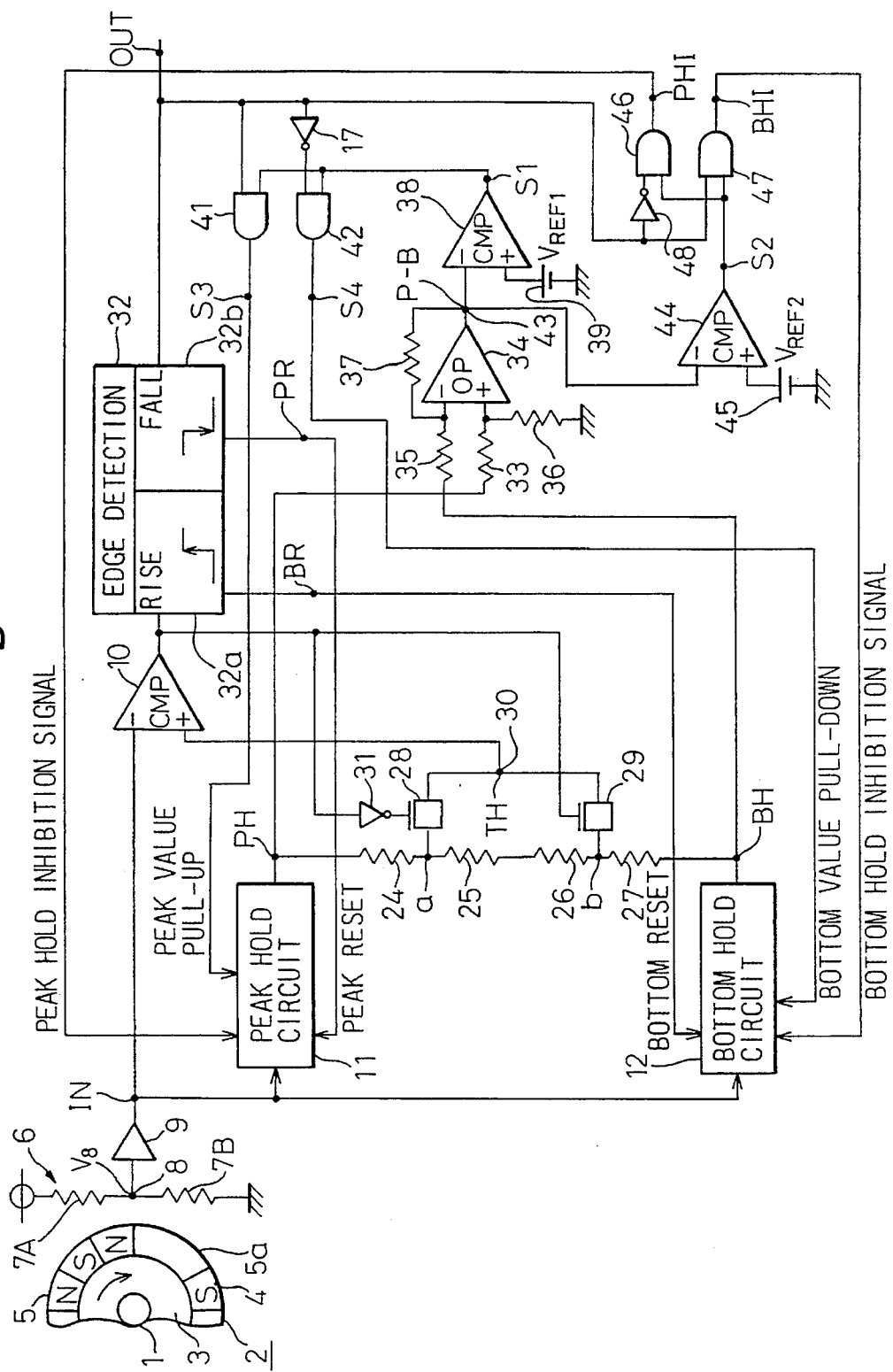
FIG. 1 is a circuit diagram of a sensor signal processing unit according to an embodiment of the present invention.

FIG. 1 is a circuit diagram of a sensor signal processing unit according to an embodiment of the present invention. This sensor signal processing unit is an apparatus for detecting a rotation position of an engine.

As depicted in FIG. 1, a disc,like rotary member 2 is fixedly fitted to a shaft 1 which rotates with the revolution of the engine at a rotating speed of ½. The rotary member 2 comprises a magnet holding portion 3 made of a non-magnetic material (e.g., austenite type stainless steel) and a ferrite magnet 4 having an annular shape and fixed around the magnet holding member 3. A magnetization plane 5, wherein magnetic poles having different polarities are alternately and equidistantly magnetized, is disposed on an outer peripheral surface of the ferrite magnet 4. A reference position 5a at which magnetization is removed and which has a wide pitch is disposed at a part of the magnetization plane 5.

A rotating angle sensor 6 includes a pair of MREs (magnetoresistance elements) 7A and 7B so disposed on the magnetization plane 5 of the rotary member 2 as to oppose each other. A power supply is connected in series with these MREs 7A, 7B. An amplifier 9 is connected to the junction 8 between the MREs 7A and 7B. The resistance value of each MREs 7A, 7B changes in accordance with the magnetic field intensity in the circumferential direction with the rotation of the rotary member 2. As a result, the voltage at the Junction 8 between the MREs 7A and 7B changes, and a voltage signal is output from the rotating angle sensor 6. The signal waveform at this junction 8 is represented by V18 in FIG. 2, and the signal waveform at the output portion of the amplifier 9 is represented by IN in FIGS. 2 and 3.

The output terminal of the amplifier 9 is connected to an inverting input terminal of a comparator 10.

The output terminal of the amplifier 9 is further connected to a peak hold circuit 11 and to a bottom hold circuit 12.

Figure 4:
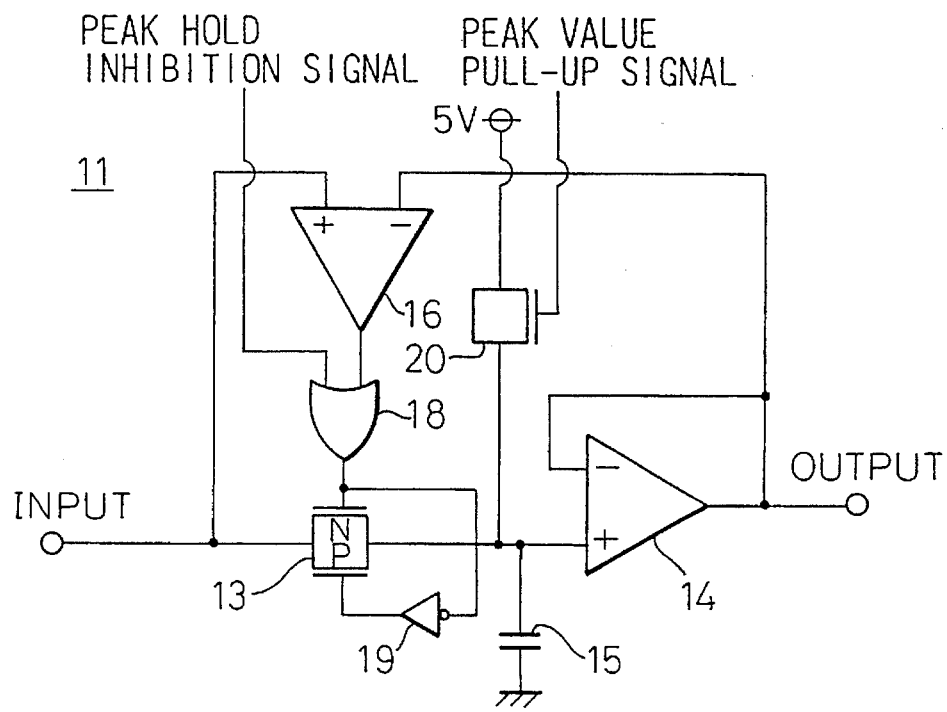
FIG. 4 is a structural view of a peak hold circuit.
Figure 5:
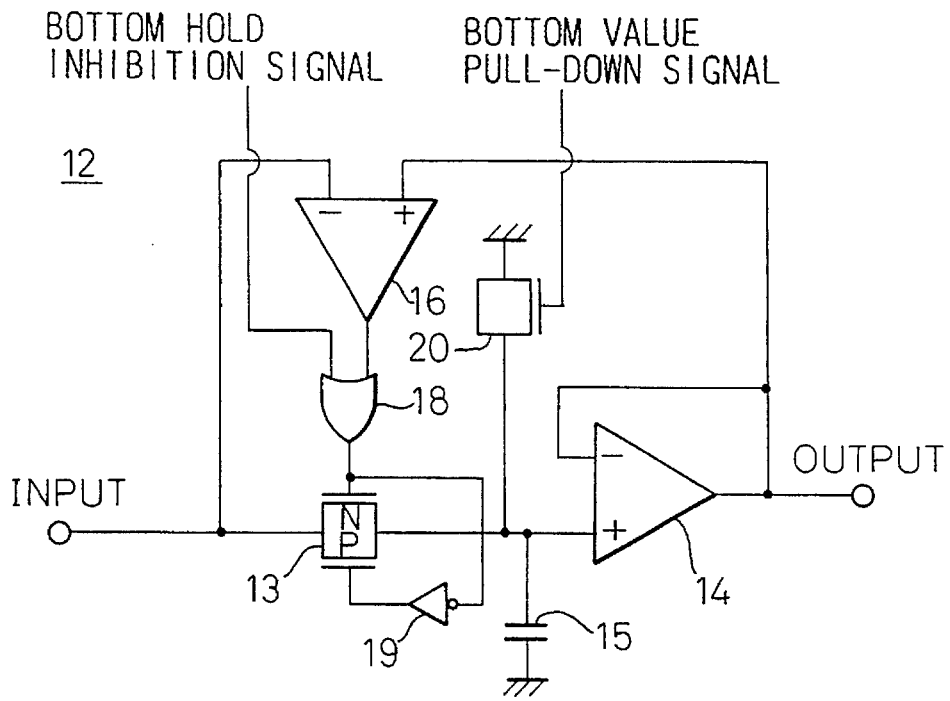
FIG. 5 is a structural view of a bottom hold circuit.

FIG. 4 shows a definite structural example of the peak hold circuit 11 and FIG. 5 shows a definite structural example of the bottom hold circuit 12.

In FIG. 4, the input terminal is connected to a non-inverting input terminal of a CMOS operational amplifier 14 through an analog switch 13. An MOS hold capacitor 15 is connected to the non-inverting input terminal of the CMOS operational amplifier 14. Negative feedback is applied to the output terminal of the CMOS operational amplifier 14, and this output terminal is connected to the non-inverting input terminal of a CMOS comparator 16. The output terminal of this CMOS comparator 16 is connected to an OR gate 18, and the output terminal of the OR gate 18 is connected to a control terminal of an analog switch 13. A NOT circuit 19 is interposed between both control terminals of the analog switch 13.

A 5 V power supply is connected to a non-inverting input terminal of the CMOS operational amplifier 14 through another analog switch 20.

In the bottom hold circuit shown in FIG. 5, the circuit construction is substantially the same as that of the peak hold circuit 11 shown in FIG. 4, but the connection of the two input terminals of the CMOS comparator 16 are reversed and the non-inverting input terminal of the CMOS operational amplifier 14 is grounded through the analog switch 20.

As is obvious from the definite example given above, the sensor signal processing unit according to the present invention comprises the peak hold means for holding the peak value of the output signals from the sensor, the bottom hold means for holding the bottom value of the output signals from the sensor, the threshold value setting means for setting the threshold value from the peak value from the peak hold means and the bottom value from the bottom hold means, and the comparison means for comparing the output signal of the sensor with the threshold value set by the threshold setting means and outputting a binary signal in accordance with their difference.

In the sensor signal processing unit according to the present invention described above, the peak hold means or the bottom hold means includes the operational amplifier, the analog switch is disposed at one of the input terminals of this operational amplifier so as to input the output signal of the sensor and the output of the operational amplifier to the CMOS comparator, and the output terminal of this CMOS comparator is connected to the control terminal of the analog switch. In this way, charging of the capacitor is controlled by controlling the analog switch so as to effect holding of the peak value or the bottom value.

When the construction described above is added to the sensor signal processing unit, the output signal of the sensor and the output of the operational amplifier are input to the CMOS comparator, and when the analog switch is controlled by the output of the CMOS comparator, charge to the capacitor is controlled and peak holding or bottom holding is effected. As a result, it is possible to obtain the effect that the potential of the capacitor can be held by controlling the analog switch, and the output level does not change.

In the sensor signal processing unit according to the present invention as described above, on the other hand, it is preferred to forcedly deviate the comparator input by a predetermined potential in order to eliminate any mistake in holding due to offset of the CMOS comparator.

It is also preferred that the peak value of the peak hold means and the bottom value of the bottom hold means be forcedly set to mutually different values at the turn-on time of the power supply.

When such a construction is employed, the CMOS comparator input is forcedly deviated by a predetermined potential and a mistake in holding due to an offset of the CMOS comparator can be eliminated. Further, the peak value of the peak hold means and the bottom value of the bottom hold means can be forcedly set to the mutually different values at turn-on time of the power supply, so that chattering of the output can be prevented.

The sensor signal processing unit according to the present invention can be applied to a moving body having equidistant portions, at which magnetic substances are equidistantly disposed, and a reference position portion, for converting the equidistant portions and the reference position portion to electric signals. In such a case, a construction is preferably employed so that, when one of the peak value hold means and the bottom value hold means holds the respective hold value, the holding operation is inhibited unless the peak value or the bottom value exceeds a predetermined voltage.

According to this construction, the peak value hold means or the bottom value hold means is inhibited from holding the peak value or the bottom value unless the difference between the peak value and the bottom value exceeds a predetermined voltage during the holding operation of the respective means. As a result, the reference position portion can be stably detected by changing setting of the difference voltage between the peak hold value and the bottom hold value in accordance with a ratio of the signal of the equidistant portions to the signal of the reference position portion after confirming the amplitude of the error signal output of the reference position portion of the sensor.

The processing unit can be made compact through full LSI into a CMOS chip.

Next, the characterizing features of the peak hold circuit 11 shown in FIG. 4 and the bottom hold circuit shown in FIG. 5 will be explained.

Figure 6:
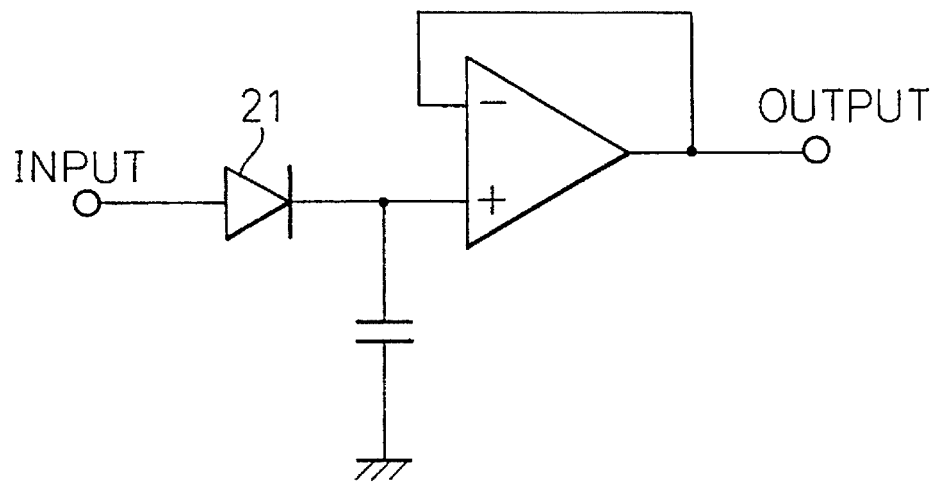
FIG. 6 is a structural view of a peak hold circuit for comparison.
Figure 7:
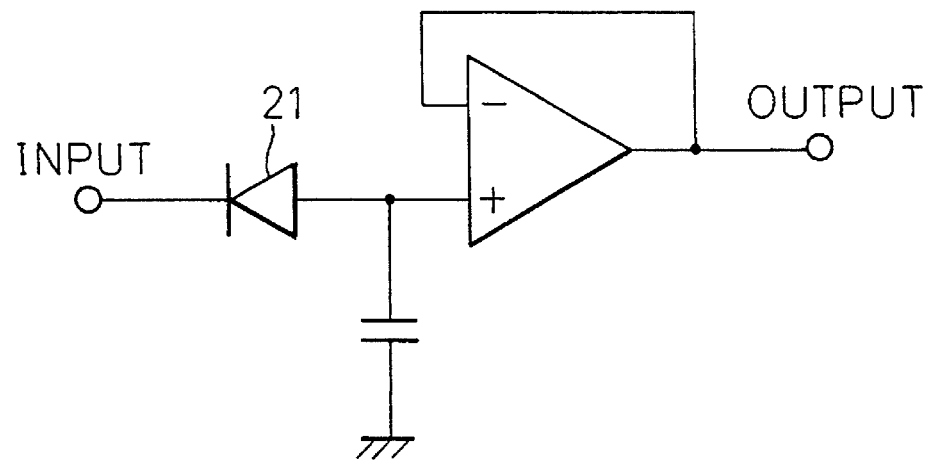
FIG. 7 is a structural view of a bottom hold circuit for comparison.

A typical peak hold circuit according to the prior art is shown in FIG. 6, and a typical bottom hold circuit is shown in FIG. 7.

The peak hold circuit (shown in FIG. 6) has been accomplished in the past by utilizing the characteristic feature that a current is caused to flow in only one direction through a diode 21. According to this system, however, only a voltage which is lower by a forward voltage drop Vp of the diode than the actual peak voltage, can be held because such a voltage drop Vp exists in the diode 21. To incorporate such a peak hold circuit into a CMOS LSI, it is essentially necessary to fabricate a BiCMOS structure and to assemble a pure diode devoid of a parasitic effect, inside the LSI. However, this embodiment can avoid such a problem because the analog switch 13 and the CMOS comparator 16 are used in place of the diode 21.

Here, the operation of the peak hold circuit (FIG. 4) will be explained. The CMOS comparator 16 compares the peak hold output voltage with the input voltage. When the input voltage is higher than the output voltage, the output of the CMOS comparator 16 is "1", the analog switch 13 is turned on, and charging of the MOS hold capacitor 15 begins. When the potential of the MOS hold capacitor 15 rises, the output voltage similarly rises. Charging continues until the input voltage is equal to the output voltage, at which time the CMOS comparator 16 outputs "0" and the analog switch 13 is turned off. Even when the input voltage drops thereafter, the analog switch 13 is turned off, because the MOS hold capacitor 15 holds the potential, so the output level does not change and the peak value of the input voltage is continuously held.

Since this operation also holds true of the bottom hold circuit (FIG. 5), its explanation will be omitted. However, the only difference is that the voltage to be held is the bottom value in the case of the bottom hold circuit.

Incidentally, in order to let the peak hold circuit 11 shown in FIG. 4 and the bottom hold circuit 12 shown in FIG. 5 operate stably, the output must reliably become "0" when the non-inverting input terminal and the inverting input terminal in the CMOS comparator 16 reach exactly the same value. Otherwise, the analog switch 13 cannot be turned off even when the input voltage goes over the peak value and starts decreasing, and there is a possibility that the peak voltage cannot be held.

Another embodiment of the present invention is directed to solving such a problem. In other words, an application example of the peak value hold circuit 11 shown in FIG. 4 and the bottom hold circuit 12 shown in FIG. 5 is shown in FIGS. 8 (peak hold circuit) and 9 (bottom hold circuit 12).

Figure 8:
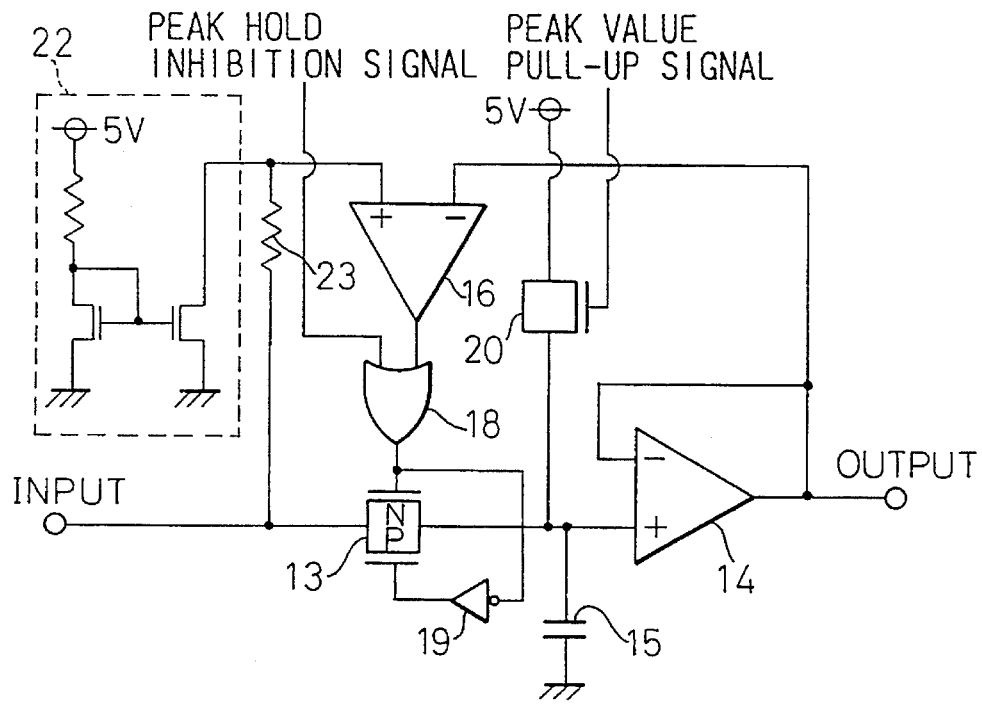
FIG. 8 is a structural view of a peak hold circuit of an application example.

To cope with the problem described above, forced offset is provided to the input of the CMOS comparator 16 as shown in FIGS. 8 (peak hold circuit) and 9 (bottom hold circuit 12). In other words, in FIG. 8, a current mirror circuit 22 is connected to the non-inverting input terminal of the CMOS comparator 16, and a resistor 23 is interposed between the input terminal and the non-inverting input terminal of the CMOS comparator 16. The potential at the non-inverting input terminal of the CMOS comparator 16 is set to be lower by 20 mV as a potential corresponding to the offset voltage, and to a noise component, by a constant current and the resistor 23. According to this circuit construction, since peak detection can be stably made, peak hold is possible to a low frequency as low as 0.1 Hz. In other words, peak hold can be made to a lower frequency by slightly raising the output voltage of the CMOS operational amplifier 14 during the delay time of the CMOS comparator 16. By the way, when such a circuit (the current mirror circuit 22 and the resistor 23) is not provided, the lowest operation limit is 40 Hz.

Figure 9:
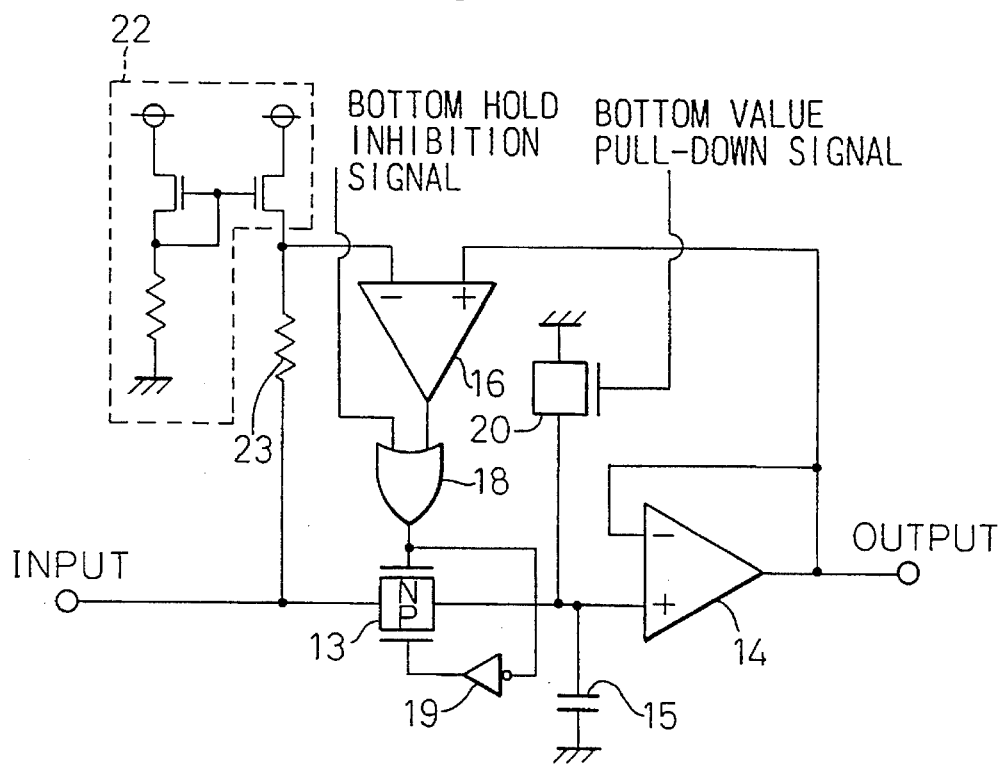
FIG. 9 is a structural view of a bottom hold circuit of an application example.
Figure 10:
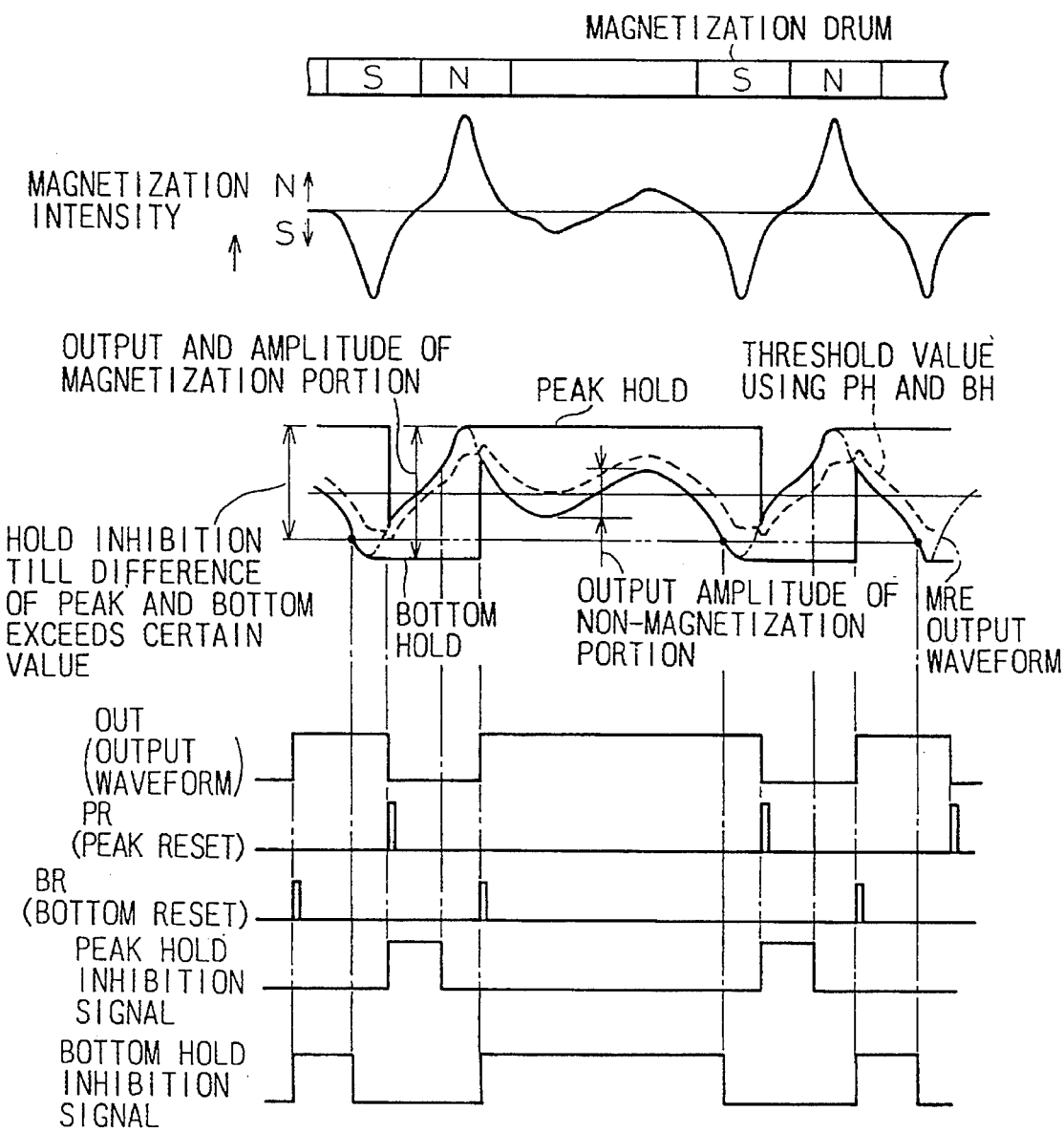
FIG. 10 is a timechart showing various waveforms.

The similar situation as explained above, can be applicable to the bottom hold circuit shown in FIG. 9, and accordingly, a voltage which is higher than the output by 20 mV, as an offset voltage and a noise component, is set by connecting a current mirror circuit 22 and the resistor 23 to the inverting input terminal of the CMOS comparator 16.

Turning back again to FIG. 1, on the other hand, four resistors 24, 25, 26 and 27 are connected in series between the output terminal of the peak hold circuit 11 and the output terminal of the bottom hold circuit 12. Analog switches 28 and 29 are interposed in series between the junction a of the resistors 24 and 25 and the junction b of the resistors 26 and 27. The junction 30 between both analog switches 28, 29 is connected to the non-inverting input terminal of the comparator 10. The output terminal of the comparator 10 is connected to the control terminal of the analog switch 29. Further, the output terminal of the comparator 10 is connected to the control terminal of the analog switch 28 through the NOT circuit 31.

An edge detection circuit 32 is connected to the output terminal of the comparator 10, and includes a rising edge detection portion 32a and a falling edge detection portion 32b. The rising edge detection circuit 32a detects the rising edge of the output signal of the comparator 10, and outputs a bottom reset signal to the bottom hold circuit 12. The falling edge detection circuit 32b detects a falling edge of the output signal of the comparator 10 and outputs a peak reset signal to the peak hold circuit 11.

Figure 2:
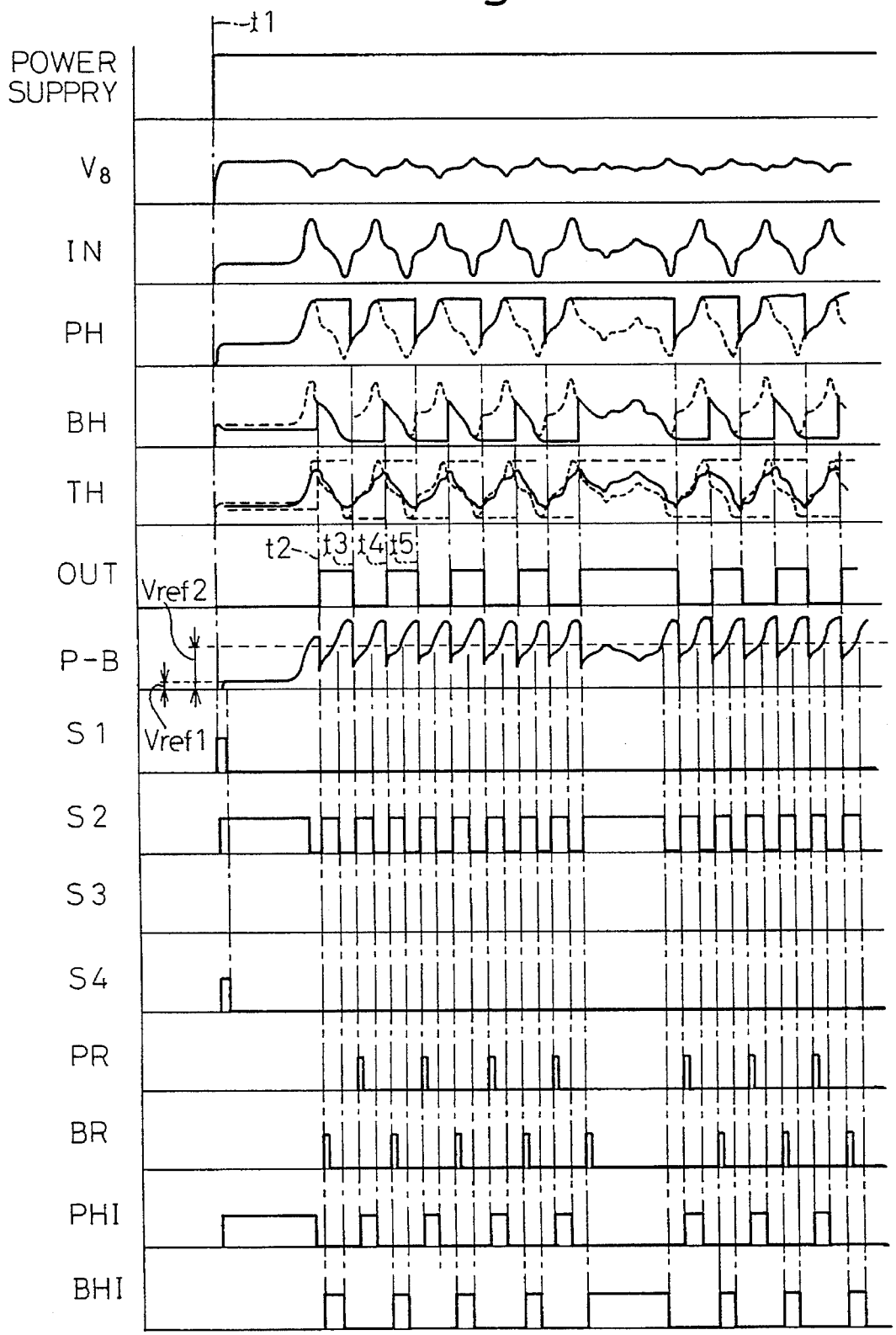
FIG. 2 is a timechart showing various waveforms.
Figure 3:
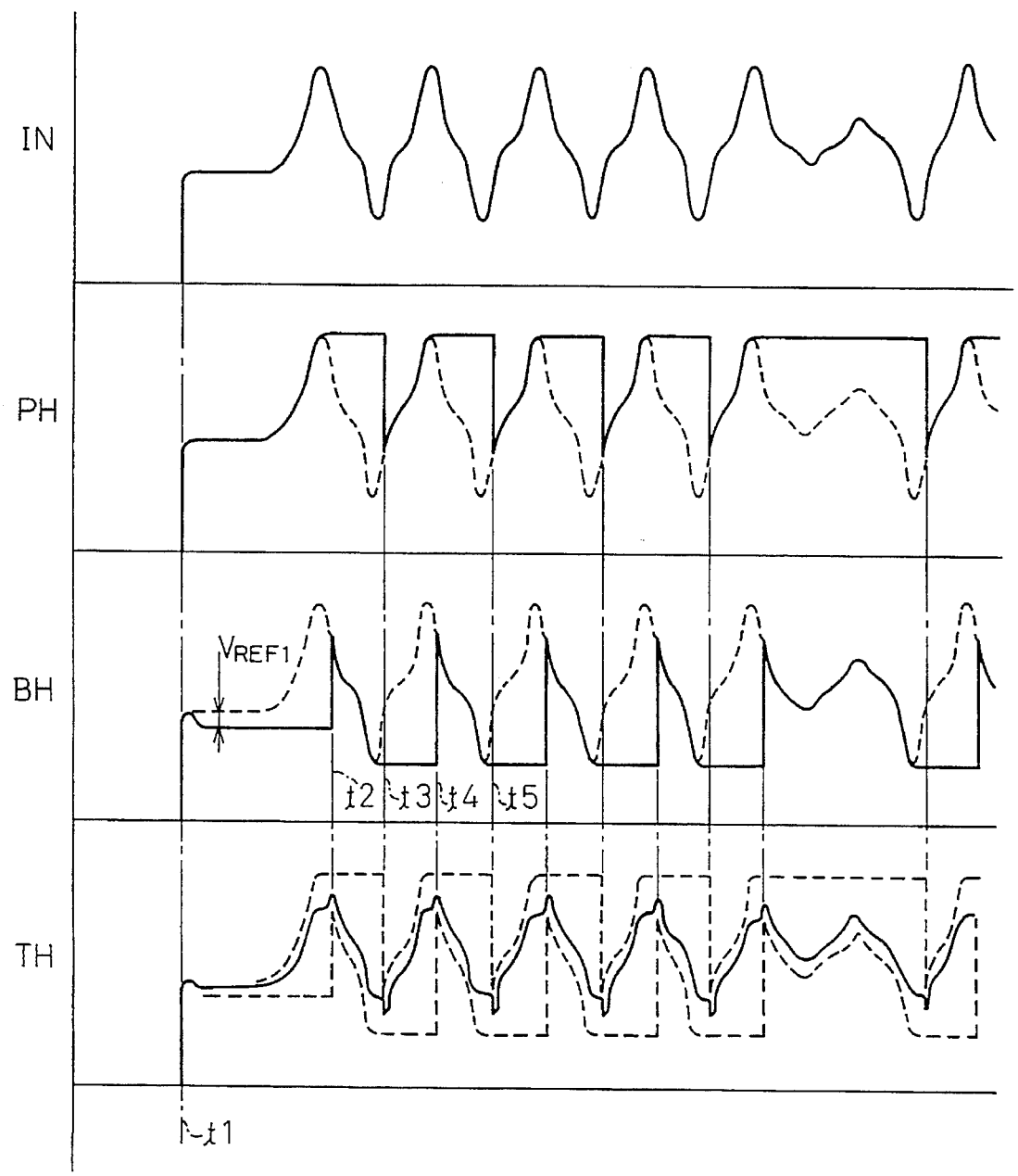
FIG. 3 is also a timechart showing various waveforms.

In FIGS. 2 and 3, the waveform of the output signal of the peak hold circuit 11 is represented by PH and the waveform of the output signal of the bottom hold circuit 12, by BH. Further, the waveform of the signal at the junction 30 between the analog switches 28 and 29 is represented by TH.

In FIG. 2, the bottom reset signal from the rise detection portion 32a of the edge detection circuit 32 is represented by BR, and the peak reset signal from the fall detection portion 32b, by PR.

Further, in FIG. 2, the output signal of the comparator 10 is represented by OUT.

The operation of the circuit having the circuit construction so far explained will be described next. The processing unit includes the peak hold circuit 11 and the bottom hold circuit 12, and a voltage between the peak hold value and the bottom hold value is generated by the resistor voltage division by the resistors 24 to 27, and this voltage is provided as the non-inverting input terminal voltage of the comparator 10. As soon as the comparator 10 changes from the H level to the L level (timings t3 and t5 in FIGS. 2 and 3) or vice versa (timings t2 and t4 in FIGS. 2 and 3), the peak value or the bottom value is reset so as to greatly change the potential at the non-inverting input terminal of the comparator 10 and to thus greatly deviate the threshold value to prevent incorrect operation.

In other words, the potential at the non-inverting input terminal of the comparator 10 is switched to (¼)·(PH−BH) and (¾)·(PH−BH) in accordance with the H or L level of the output of the comparator 10. Here, symbols PH and BH represent the peak hold value and the bottom hold value, respectively. Accordingly, the processing unit stably operates not only for the sensor output of a triangular wave or a sine wave but also for a sensor output waveform which is nearly flat at the center of the waveform amplitude.

The voltage at the non-inverting input terminal of the comparator is derived by resistor voltage division at a value between the peak hold value and the bottom hold value. Consequently, even when the peak and bottom values of the waveform change in accordance with each peak and valley, angle accuracy of the edge of the OUT waveform can be retained correctly because the threshold value is given by the amplitude ratio.

By the way, the lowest operation frequency is determined by the peak hold time and the bottom hold time, and it can be confirmed through experiments that stable operation can be obtained to 0.1 Hz by the use of a hold capacitor of 100 PF. This is a sufficient value for normal use.

In FIG. 1, the output terminal of the peak hold circuit 11 is connected to the non-inverting input terminal of the operational amplifier 34 through the resistor 33. The output terminal of the bottom hold circuit 12 is connected to the inverting input terminal of the operational amplifier 34 through the resistor 35. The non-inverting input terminal of the operational amplifier 34 is grounded through the resistor 36. The output terminal of the operational amplifier 34 receives negative feedback through the resistor 37.

The output terminal of the operational amplifier 34 is connected to the inverting input terminal of the comparator 38, and the reference power supply 39 is connected to the non-inverting input terminal of the comparator 38. The output terminal of the comparator 38 is connected to one of the input terminals of each of two AND gates 41 and 42. The other input terminal of the AND gate 41 is connected to the output terminal of the comparator 10, and the other input terminal of the AND gate 42 is connected to the output terminal 10 of the comparator 10 through a NOT circuit 17. The output terminal of the AND gate 41 is connected to the peak hold circuit 11 by a peak value pull-up line. The output terminal of the AND gate 42 is connected to the bottom hold circuit 12 through a bottom value pull-down line.

In FIG. 2, the output waveform of the operational amplifier 34 is represented by (P−B). The output waveform of the comparator 38 is represented by S1, the output waveform of the AND gate 41, by S3, and the output waveform of the AND gate 42, by S4.

The operation of the circuit which has been so far described will be explained next. The operational amplifier 34 computes the difference between the peak hold value (PH) and the bottom hold value (BH). When this difference is smaller than the value of the reference voltage $V_{ref1}$ of the reference power supply 39, the comparator 38 outputs "1". Then, the analog switch 20 shown in FIG. 4 or the analog switch 20 shown in FIG. 5 is closed (turned on), and the peak value or the bottom value is pulled towards 5 V or 0 V.

When the difference PH−BH becomes greater than the reference voltage $V_{ref1}$ of the reference power supply 39, the output of the comparator 38 becomes "0", and the analog switch 20 shown in FIG. 4 or the analog switch 20 shown in FIG. 5 is opened (turned off), so that PH−BH is fixed to a value equal to the reference voltage $V_{ref1}$.

When the circuit operates at the time of turn-on of the power supply (at the timing t1 in FIGS. 2 and 3), whether or not the difference PH−BH is smaller than the reference voltage $V_{ref1}$ is immediately Judged, and the peak hold value (PH) is pulled away from the bottom hold value (BH).

Normally, the input signal is constant when the power supply is turned on. Accordingly, the peak hold value (PH) and the bottom hold value (BH) are equal to each other. When the circuit of this embodiment is used, however, the peak hold value (PH) can be pulled away from the bottom hold value (BH) simultaneously with turn-on of the power supply, and the CMOS comparator 10 shown in FIG. 1 can be prevented from effecting incorrect judgement due to very small noise of the power supply, so that chattering of the output can be prevented.

On the other hand, the inverting input terminal of the comparator is shown connected to the junction 43 between the operational amplifier 34 and the comparator 38 in FIG. 1. The non-inverting input terminal of the comparator 44 is connected to a reference power supply 45 ($V_{ref2}$). The output terminal of the comparator 44 is connected to one of the input terminals of each of the two AND gates 46 and 47. The other input terminal of the AND gate 47 is connected to the output terminal of the comparator 10, and the other input terminal of the AND gate 46 is connected to the output terminal of the comparator 10 through the NOT circuit 48.

The output terminal of the AND gate 46 is connected to the OR gate 18 shown in FIG. 4 by a peak hold inhibition line. The output terminal of the AND gate 47 is connected to the OR gate 18 shown in FIG. 5 through a bottom hold inhibition line.

In FIG. 2, the output waveform of the comparator 44 is represented by S2, the output waveform of the output terminal of the AND gate 46, by PH1 and the output waveform of the output terminal of the AND gate 47, by BH1.

The operation of the circuit having the construction which has been so far explained will be described next. When the bottom value does not deviate by a predetermined voltage during the peak holding operation, the bottom hold inhibition signal (BHI) is generated and bottom hold is inhibited. Accordingly, the threshold value always becomes greater than the MRE output waveform and the output is fixed at the H level, so that the reference position of the rotary member 2 can be detected.

The reverse is also true. In other words, so long as the peak value does not deviate by a predetermined voltage during the bottom hold operation, the peak hold inhibition signal (PHI) is output, and peak hold is inhibited. Accordingly, the threshold value is always smaller than MRE output waveform, and the output is kept fixed at the L level.

The reference voltage is made variable by the output amplitude ratio at the portions having a narrow magnetization pitch and the reference position devoid of magnetization. Accordingly, the reference position devoid of magnetization can be stably detected by merely updating the set voltage of the difference of the PH–BH value in accordance with the ratio of the output amplitude at the portions having a narrow magnetization pitch and the output amplitude at the reference position devoid of magnetization.

In comparison with the prior art system, one of the characterizing features of the sensor signal processing unit according to the present invention described above resides in that the threshold value is set on the basis of the peak value (or the bottom value) immediately after the passage of the peak or bottom of the output signal of the sensor. The present invention can drastically improve angle accuracy of binary pulses on the basis of the technical concept described above.

More definitely, in FIG. 3, IN represents the sensor output waveform, PH is the peak hold (peak value) waveform, BH is the bottom hold (bottom value) waveform, and TH is the threshold value waveform set on the basis of the peak value and the bottom value. This TH is given by ¾×(PH–BH) during the period of t1 to t2 and the period of t3 to t4, and is given by ¼×(PH–BH) during the period of t2 to t3 and the period of t4 to t5. Since the threshold value TH is given by the proportional relationship between the peak value and the bottom value (¼ and ¾ in this case), angle accuracy can be maintained even when the peak value and the bottom value change. In this case, the threshold value TH is set after passing by the peak or the bottom of the waveform and outputs the pulse edge (the instant that the sensor output waveform IN passes by TH). Accordingly, the pulse is output on the peak value and the bottom value appearing immediately before, and angle accuracy is high. In other words, the threshold value is set in accordance with the proportional relationship immediately after the waveform passes by the peak and the bottom, and the pulse output is generated.

For the reason described above, digitization (binary output) can be effected with high angle accuracy even for a sensor output waveform the height of the peak and bottom of which change for each pulse output.

Figure 15A:
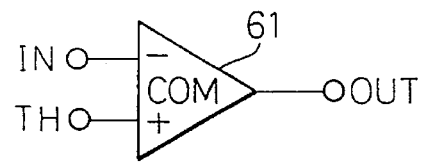
FIG. 15(A) is a diagram showing input/output of a comparator.
Figure 15B:
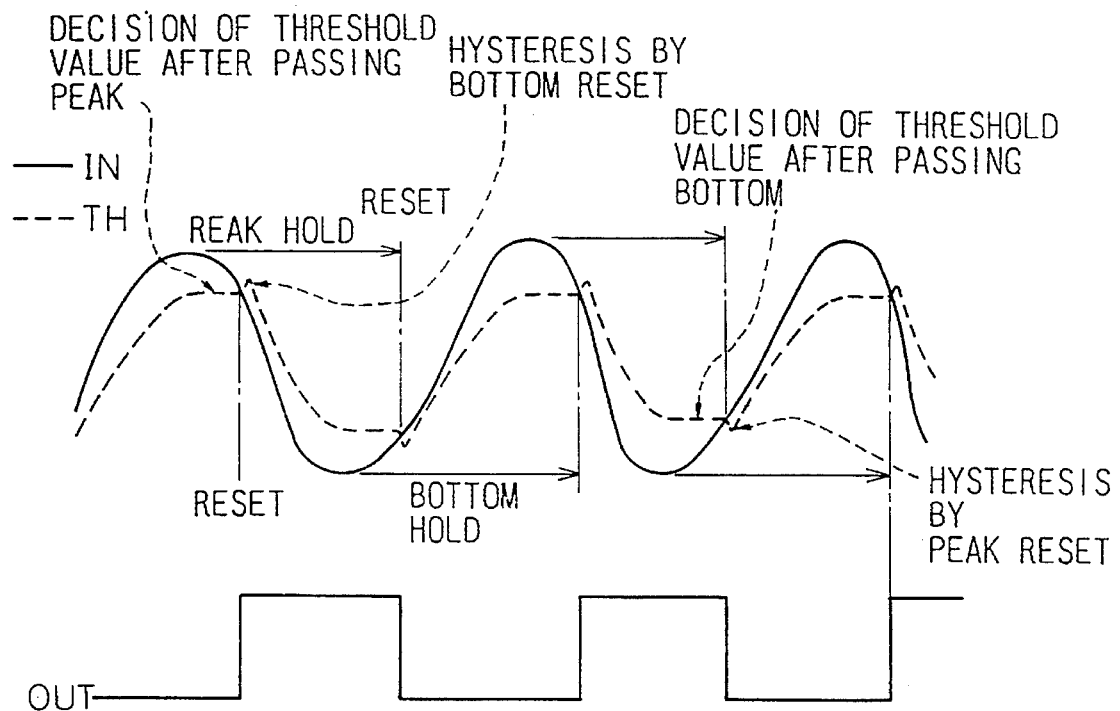
FIG. 15(B) is a diagram showing an input/output timechart of the comparator.

In other words, as can be understood from the waveforms shown in FIG. 15(B), the generation of the threshold value and digitization (pulse forming) are effected after passing by each peak or bottom. Accordingly, angle accuracy is high. Further, high angel accuracy can be secured by effecting resetting and digitization after each peak in addition to the storage of the peak and the bottom. Hysteresis can also be added to a comparison voltage by resetting the peak (or the bottom).

When such hysteresis is added, the occurrence of chattering can be prevented when the voltage level of the input signal is close to the threshold value.

The sensor signal processing unit of this embodiment is fully constituted into a CMOS chip by LSI.

As described above, the digitization apparatus of this embodiment comprises the peak hold circuit 11 (peak hold means) for holding the peak value of the output signal from the rotating angle sensor 6, the bottom hold circuit 12 (bottom hold means) for holding the bottom value of the output signal of the rotating angle sensor 6, the resistors 24 to 27, the analog switches 28, 29 and the NOT circuit 31 (threshold value setting means) for setting the threshold value from the peak value from the peak hold circuit 11 and the bottom value from the bottom hold circuit 12, and the comparator 10 (comparison means) for comparing the threshold value set by the resistors 24 to 27, the analog switches 28, 29 and the NOT circuit 31 (threshold setting means) with the output signal of the rotating angle sensor 6, and outputting the binary signal in accordance with the comparison result.

In the afore-mentioned patent publication (Japanese Unexamined Patent Publication (Kokai) No. 4-77671), an amplifier having a large amplification ratio and an amplifier having a small amplification ratio must be provided. However, the present invention does not require the two amplifiers but uses only one amplifier 9. Accordingly, the circuit of the present invention can be simplified.

Each of the peak hold circuit 11 and the bottom hold circuit 12 shown in FIGS. 4 and 5 includes the CMOS operational amplifier 14 and employs the circuit construction wherein the analog switch 13 is provided at one of the input terminals of this operational amplifier 14, the sensor output signal and the output of the CMOS operational amplifier 14 are applied to the CMOS comparator 16, and the output terminal of the CMOS comparator 16 and the control terminal of the analog switch 13 are connected to control the analog switch 13 so that charging of the MOS hold capacitor 15 can be controlled by controlling the analog switch 13 to execute peak hold or bottom hold operation. As a result, the potential of the MOS hold capacitor 15 can be held by controlling the analog switch 13, and the output level does not change.

Here, since the input of the CMOS comparator 16 is forcedly deviated by a predetermined potential as shown in FIGS. 8 and 9, the hold error due to offset of the CMOS comparator 16 can be eliminated.

When the power supply is turned on, the peak value by the peak hold circuit 11 and the bottom value by the bottom hold circuit 12 are forcedly set to mutually different values. As a result, chattering of the output at the turn-on time of the power supply can be prevented.

The rotating angle sensor 6 converts the equidistant portions and the reference position portions into electrical signals for the moving member having such equidistant portions and reference position portions, and the peak hold circuit 11 or the bottom hold circuit 12 inhibits holding of the peak value or the bottom value unless the peak value or the bottom value reaches at least a predetermined voltage during its holding operation. As a result, the reference position portions which output an error signal having a smaller amplitude than that of the signals of the equidistant portions of the sensor can be correctly detected.

The sensor signal processing unit in this embodiment is completely converted to the CMOS chip by a LSI configuration, and therefore its size can be reduced.

Figure 11:
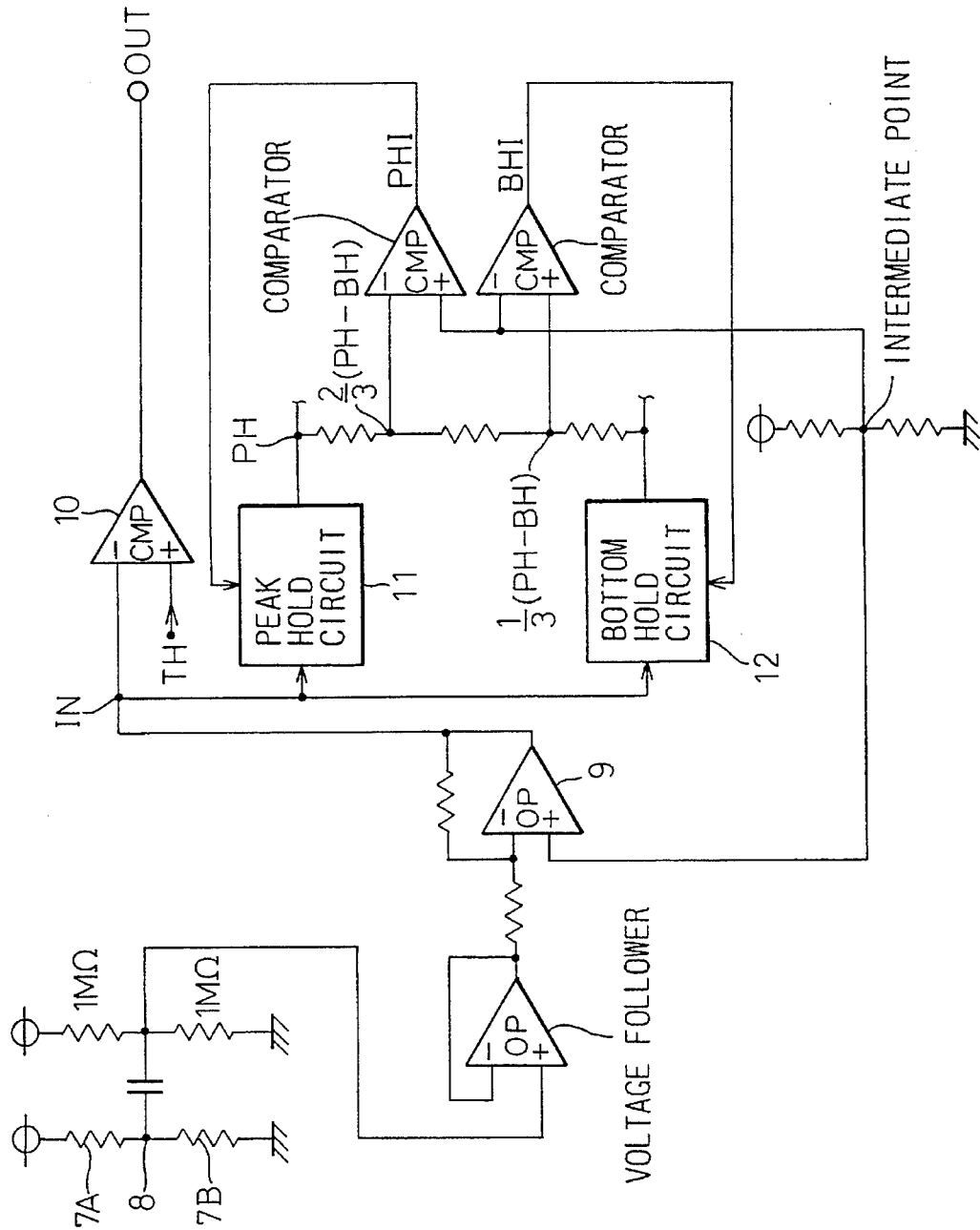
FIG. 11 is a structural view of a circuit for error signal judgement of an application example.
Figure 12:
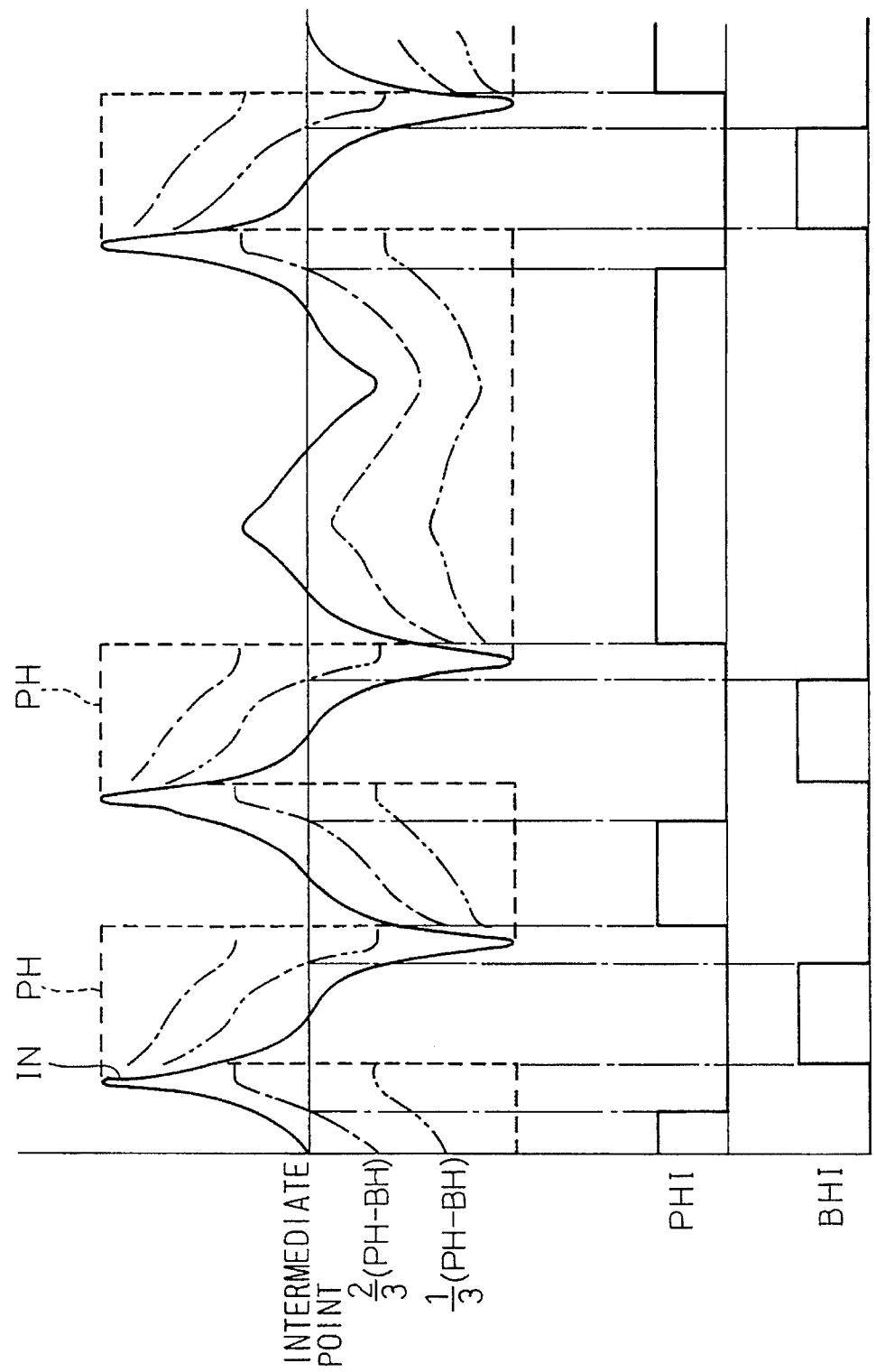
FIG. 12 is a timechart showing various waveforms.

By the way, an error signal having a small amplitude can be discriminated not only by comparison with a predetermined voltage as is made in this embodiment, but also by a ratio of the difference voltage of the peak and bottom values, i.e., PH–BH, as shown in the circuit construction of FIG. 11 and the timing chart of FIG. 12.

Next, another method and apparatus for controlling the output of the sensor signal in the sensor signal processing unit according to the present invention will be explained with reference to FIGS. 13 to 15(A), 15(B).

In addition to the construction of the above embodiment, the sensor signal processing unit of this embodiment includes signal amplification means for adding an offset signal to an output signal of a magnetism detection sensor for sensing magnetism, converting it to an electrical signal and outputting the signal, and amplifying the electrical signal; signal judgement means for outputting an offset adjustment start signal when the output signal of the signal amplification means exceeds a desired upper limit value or the lower limit value; cycle signal generation means for outputting a cycle signal by the offset adjustment start signal; count means for changing a count value by the cycle signal; and output correction means comprising offset signal output means for outputting an offset signal corresponding to the count value.

In the sensor signal processing unit having the construction described above, the peak value and the bottom value of the output of the magnetism sensor are held when the output signal of the magnetism detection sensor is digitized, and a digitization threshold value is set by these values. Accordingly, once the output of the magnetism detection sensor is corrected by the output correction circuit, the digitization threshold value can thereafter be set by the peak/bottom hold means, and the correction operation of the output correction circuit is not necessary. In other words, the cycle signal for correction need not be oscillated for correction during the normal operation after the output correction, and a drop in angle accuracy caused by the oscillation spike noise can be prevented.

Hereinafter, the construction of this embodiment will be explained with reference to the drawings.

Figure 13:
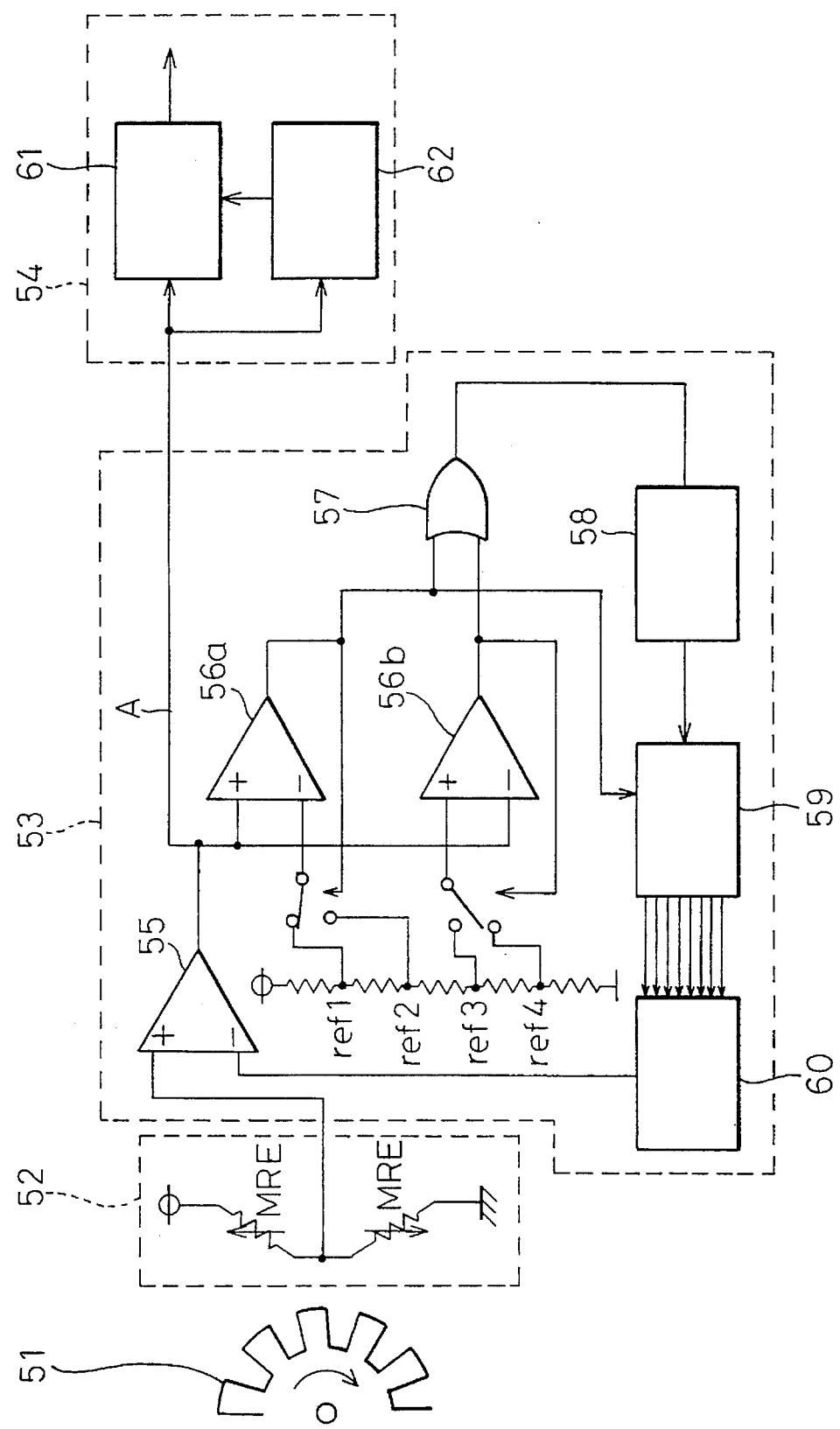
FIG. 13 is a circuit diagram showing a part of a single processing circuit of an angular sensor.

FIG. 13 shows a gear 51, an MRE bridge circuit 52, an output correction circuit 53 and a digitization circuit 54.

Figure 14:
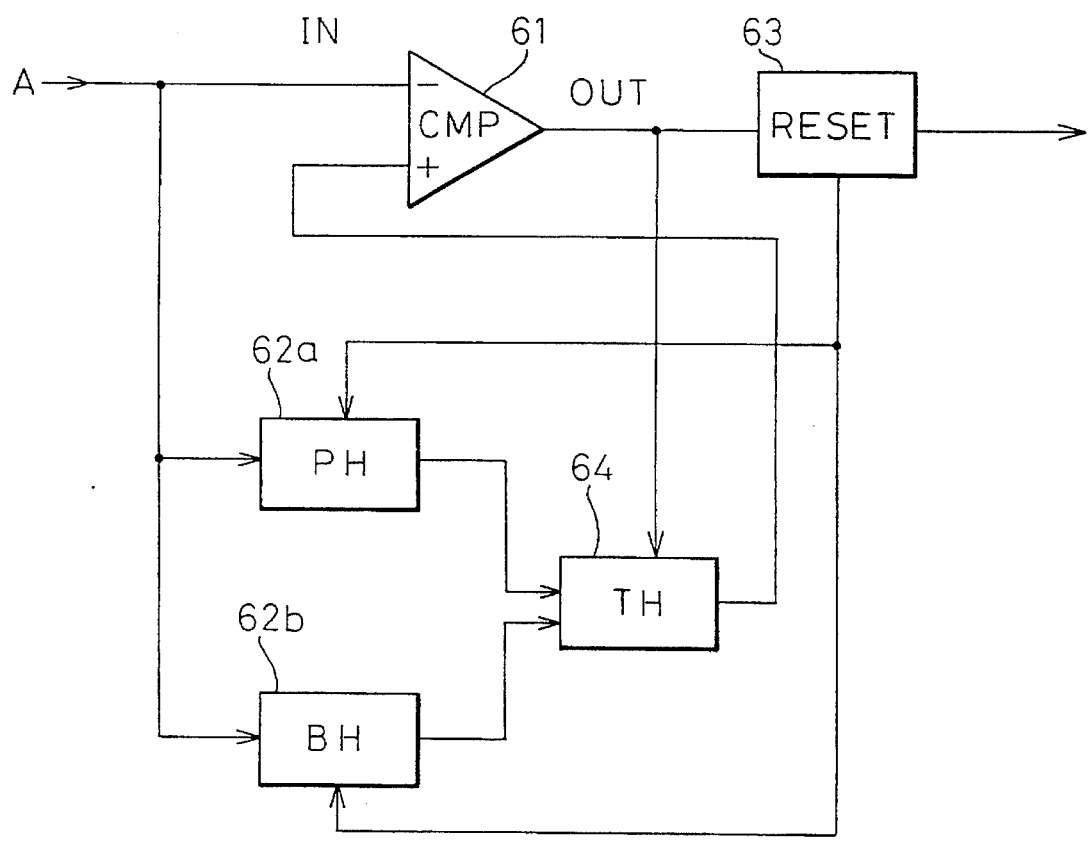
FIG. 14 is a block diagram showing an example of digitizing circuit.

First, the digitization circuit 54 will be explained with reference to FIG. 14. This circuit comprises a binary pulse forming comparator 61 which receives the output signal A corrected and amplified by the MRE bridge circuit 52 as a reversal input, a peak hold circuit 62a and a bottom hold circuit 62b that hold the peak value and the bottom value of the output signal A, respectively, a reset circuit 63 for resetting the hold operations of these hold circuits, and a threshold setting circuit 64 for setting a threshold value as a non-inverting input to the comparator 61 from the hold values.

The circuit operation shown in FIG. 14 will be explained next with reference to a simple time chart shown in FIGS. 15(A) and 15(B). FIG. 15(A) shows the comparator 61 and FIG. 15(B) shows the time chart. The inverting input of the comparator 61, that is, the MRE output signal A, is represented by symbol IN and indicated by a solid line, the non-inverting input, that is, the threshold value is represented by TH and indicated by a dotted line, and the output is represented by OUT.

When the IN value becomes smaller than the TH value, the output of the comparator 61, i.e., OUT, becomes "High", and when the IN value becomes greater than the TH value, the output OUT becomes "Low". The peak value is the value of the peak of the MRE output signal A and the bottom value is the value of the valley. The bottom hold value is reset when the IN waveform becomes smaller than the TH waveform, that is, when OUT becomes "High", and the peak hold value is reset when the IN waveform becomes greater than the TH waveform, that is, when OUT becomes "Low". The threshold value is set by the voltage dividing resistors, for example, so that it exists between the output value of the peak hold circuit and the output value of the bottom hold circuit (hereinafter called "PH–BH"). In this embodiment, the threshold value is determined by an analog switch, etc., (not shown) which is turned on and off in accordance with the value of OUT, so that the threshold value is (¼)·(PH–BH) when OUT is "High", and is (¾)·(PH–BH) when OUT is "Low".

As described above, in the digitization circuit 54 according to this embodiment, the threshold value for digitization is not a fixed threshold value, but is continuously determined in accordance with the peak and bottom values of the MRE output signal A. In other words, even when the output changes, the threshold value corresponding to this output is always set, so that the detection error due to the output fluctuation can be prevented. Accordingly, once the offset adjustment is made after supplying the power, the offset adjustment can be stopped, that is, the oscillator of the output correction circuit can be stopped. Since adverse influence of the oscillation spike noise can thus be eliminated, high angle accuracy can be obtained.

Next, the output correction circuit 3, which is so constituted as to stop the oscillator once offset is adjusted, will be explained with reference to FIG. 13. The + input of a differential amplifier 55 receives the output of the bridge circuit 52, and the—input receives a regulation voltage generated by a D/A converter 60. The output of the differential amplifier 55 is supplied to the + input of a comparator 56a for setting the upper limit value and the–input of a comparator 56b for setting the lower limit value, and is also input to a digitization circuit 54. Any one of voltages ref1 to ref4 derived and set by dividing the power supply voltage by resistors into four stages for setting the upper and lower limit values, is supplied to the + input and the—input of the comparators 56a and 56b.

In this embodiment, ref1 or ref2 is input to the—input of the comparator 56a, and ref3 or ref4 is input to the + input of the comparator 56b. The outputs of the comparators 56a and 56b are input to an OR circuit 57. The output of the OR circuit 57 is input as an oscillation start signal to an oscillator 58, and the output of the oscillator 58 is input to an up/down counter 59. An up/down FLAG which decides to which side the up/down counter 59 should operate in accordance with the output of the comparator 56 is input to the up/down counter 59. In other words, the up/down counter 59 effects count-down when the output of the comparator 56a is "High", and effects count-up when this output is "Low". The output of the counter 59 is input to the D/A converter.

Next, the operation of a circuit block shown in FIG. 13 will be explained. It will be assumed here that the gain of the differential amplifier (operational amplifier) 55 is set so that the output of this amplifier 55 is not higher than the set voltage ref1 and not lower than the set voltage ref4 when the signal of the MRE bridge circuit 52 is amplified. The value of ref1 is below the upper limit value of the output voltage range of the operational amplifier and the value of ref4 is above the lower limit value of the output voltage. The values ref2 and ref3 are set to values to which a hysteresis width is added, in order to achieve stable operation at the set values.

First, when the power supply voltage is applied, each circuit block is set to the initial state. When the gear 1 starts rotating, the balance of the MRE bridge circuit 2 is disrupted and the output voltage changes. At this time if the output of the operational amplifier 5 is greater than the set voltage ref1 (which means that the offset voltage occurs in the + direction), the output of the comparator 56a becomes "High" and the output of the OR circuit 57 becomes "High", so that the oscillator 58 starts oscillating. Then, the up/down FLAG becomes "High" and hence, the up/down counter 59 starts to count down due to the oscillation of the oscillator 58. Since the D/A convertor 60 is so wired as to output the analog voltage set by the data of this up/down counter 59, the output voltage of the D/A convertor 60 decreases. Accordingly, the output voltage of the operational amplifier 55 gradually decreases. This operation continues until the output voltage of the operational amplifier 55 drops below the value ref2. When the output voltage of the operational amplifier 55 becomes below ref2, the oscillating operation of the oscillator 58 stops, and the output voltage of the D/A convertor is fixed.

In this state, the range of the output voltage of the operational amplifier 55 is not higher than ref2 and not lower than ref4, and this is the voltage range in which the digitization circuit 4 of the post-stage of the operational amplifier stably operates.

Next, when the output voltage of the operational amplifier 5 is lower than ref4, the output of the comparator 56b becomes "High" and the output of the OR circuit 59 becomes "High", so that the oscillator 38 starts oscillating. Then, since the output of the comparator 56a is "Low" at this time, the up/down FLAG becomes "Low", so that the up/down counter 59 starts to count up due to the oscillation of the oscillator 58. In consequence, the output voltage of the D/A convertor 60 gradually increases. This operation continues until the output voltage of the operational amplifier 55 rises above ref3. When the output voltage of the operational amplifier becomes higher than ref3, the oscillating operation of the oscillator 59 stops, and the output range of the operational amplifier is fixed to a range not higher than ref1 and not lower than ref3. This is the voltage range in which the digitization circuit 54 of the post-stage of the operational amplifier 54 stably operates.

As described above, according to this embodiment, the oscillating operation of the oscillator is started when the amplification signal of the MRE bridge output exceeds the set voltage ref1 or ref4 which is set in advance, and is stopped when the output voltage of the operational amplifier enters the range described above. Accordingly, the oscillator does not oscillate during the normal operation and consequently, the influence of the oscillation spike noise can be eliminated. In other words, angle detection can be stably made with a high level of accuracy such as an absolute angle accuracy of ±0.1 and repeatability of 0.02.

Digitization of the output waveform is effected by the digitization circuit 54 comprising the binary pulse forming comparator 61 and the peak/bottom hold circuit 62. The peak/bottom hold circuit 62 stores at each sampling time the peak and bottom voltages of the output waveform of the operational amplifier 55 in a suitable memory, sets the threshold value in accordance with these voltages, and inputs it to the binary pulse forming comparator 61. The binary pulse forming comparator 61 digitizes the output waveform of the operational amplifier 55 in accordance with the threshold value set by the peak/bottom hold circuits 62a and 62b. According to this construction, the binary pulse edge can be output with high angle accuracy for the output waveform A having a suitable amplitude within a broad range of ref1 to ref4. Thereafter, the binary pulse is processed by a signal processing circuit not shown in the drawings.

We claim:

1. A sensor signal processing unit comprising:

signal amplification means for adding an offset signal to an output signal of a magnetism detection sensor for sensing magnetism, converting it to an amplifying and electrical signal and outputting said electrical signal;

signal judgement means for outputting an offset adjustment start signal when the output signal of said signal amplification means exceeds a desired upper or lower limit value;

cycle signal generation means for outputting a cycle signal by said offset adjustment start signal;

count means for changing a count value utilizing said cycle signal;

output correction means comprising offset signal output means for outputting an offset signal corresponding to said count value;

peak-bottom hold means for holding a peak value and a bottom value of the output signal from said magnetism detection sensor;

threshold value setting means for setting a threshold value from the peak value and the bottom value held by said peak-bottom hold means; and comparison means for comparing the output signal of said magnetism detection sensor with the threshold value set by said threshold value setting means, and outputting a binary signal in accordance with the comparison result.

2. A sensor signal processing unit according to claim 1, wherein said signal judgment means includes:

first signal comparison means for comparing said signal amplification means with said upper limit value;

second signal comparison means for comparing said signal amplification means with said lower limit value; and signal detection means for detecting said predetermined signal utilizing the outputs of said two signal comparison means.

3. A sensor signal processing unit according to claim 2, wherein said offset signal output means detects a direction of the change due to the output of said cycle signal generation means utilizing the output of said first or second signal comparison means.

4. A sensor signal processing unit according to claim 1, wherein at least two set values exist between said upper limit value and said lower limit value.

5. An MRE sensor signal detector comprising:

peak hold means for receiving and holding a peak value of an output signal from an MRE sensor;

bottom hold means for receiving and holding a bottom value of said output signal from said MRE sensor;

threshold value setting means, coupled to said peak hold means and said bottom hold means, for setting a threshold value related to a combination of said peak value held by said peak hold means and said bottom value held by said bottom hold means;

comparison means, coupled to said threshold value setting means, for comparing said output signal from said MRE sensor with said threshold value set by said threshold value setting means, and outputting a binary signal in accordance with the comparison result; and initial value setting means, coupled with said peak hold means and said bottom hold means, for setting an initial value of said peak hold means and an initial value of said bottom hold means which is different from said initial value of said peak hold means by decreasing said bottom value of said bottom hold means and increasing said peak value of said peak hold means when a power supply is turned on.

6. An MRE sensor signal detector according to claim 5, further comprising:

edge detection means, coupled with said comparison means, for detecting a rise or a fall of said output signal from said MRE sensor, and wherein said peak hold means and said bottom hold means are controlled by an output signal of said edge detection means.

7. An MRE sensor signal detector according to claim 6, further comprising:

peak value resetting means, coupled with said edge detection means, for resetting said peak value of said peak hold means each time said edge detection means detects a decrease in said output signal from said MRE sensor and a bottom value resetting means, coupled with said edge detection means for resetting said bottom value of said bottom hold means each time said edge detection means detects an increase in said output signal from said MRE sensor.

8. An MRE sensor signal detector according to claim 5, wherein said threshold value set by said threshold value setting means is reset on each increase or decrease of said output signal from said MRE sensor.

9. An MRE sensor signal detector according to claim 5, wherein said threshold value set by said threshold value setting means is updated each time said output signal from said MRE sensor passes said peak value or said bottom value thereof.

10. An MRE sensor signal detector comprising:

peak hold means for holding a peak value of an output signal from an MRE sensor;

bottom hold means for holding a bottom value of said output signal from said MRE sensor;

threshold value setting means, coupled with said peak hold means and said bottom hold means, for setting a threshold value related to a combination of said peak value and said bottom value;

comparison means, coupled to said threshold value setting means, for comparing said output signal from said MRE sensor with said threshold value, and for outputting a binary signal in accordance with the comparison result; and hold inhibiting means, coupled with said peak hold means and said bottom hold means, for inhibiting peak holding by said peak hold means when said bottom hold means is holding said bottom value and a difference between said output signal from said MRE and said bottom value does not exceed a predetermined value, said hold inhibiting means inhibiting bottom holding by said bottom hold means when said peak hold means is holding said peak value and a difference between said output signal from said MRE and the peak value does not exceed a predetermined value.

11. An MRE sensor signal detector comprising:

peak hold means for holding a peak value of an output signal from an MRE sensor;

bottom hold means for holding a bottom value of said output signal from said MRE sensor;

threshold value setting means, coupled with said peak hold means and said bottom hold means, for setting a threshold value related to a combination of said peak value and said bottom value; and comparison means, coupled with said threshold value setting means, for comparing said output signal from said MRE sensor with said threshold value, and outputting a binary signal in accordance with a result of said comparison;

wherein each of said peak hold means and said bottom hold means comprises:

an operational amplifier having an output terminal connected to said threshold value setting means;

a holding capacitor connected to an input terminal of said operational amplifier;

an analog switch having a first terminal connected to said input terminal of said operational amplifier, and having a second terminal connected to said MRE sensor; and a CMOS comparator having a first input terminal connected to an output of said operational amplifier, having a second terminal connected to said MRE sensor, and having an output connected to a control terminal of said analog switch to control said analog switch for outputting a result of said comparison.

12. An MRE sensor signal detector according to claim 10, wherein said CMOS comparator includes an offsetting means for offsetting a potential of said second terminal of said CMOS comparator to compensate for an offset of said CMOS comparator.

* * * * *